United States Patent [19]

Adams et al.

[11] Patent Number: 5,323,051
[45] Date of Patent: Jun. 21, 1994

[54] SEMICONDUCTOR WAFER LEVEL PACKAGE

[75] Inventors: Victor J. Adams, Tempe; Paul T. Bennett, Phoenix; Henry G. Hughes, Scottsdale; Brooks L. Scofield, Jr., Tempe; Marilyn J. Stuckey, Phoenix, all of Ariz.

[73] Assignee: Motorola, Inc., Schaumburg, Ill.

[21] Appl. No.: 807,338

[22] Filed: Dec. 16, 1991

[51] Int. Cl.[5] .................................. H01L 23/02
[52] U.S. Cl. ........................ 257/417; 257/419; 257/693
[58] Field of Search .............. 257/687, 693, 678, 727, 257/680, 684, 417, 419, 704

[56] References Cited

U.S. PATENT DOCUMENTS 3,768,157 10/1973 Buie ............................ 257/680
4,477,828 10/1984 Scherer ........................ 257/687
4,791,075 12/1988 Lin .............................. 257/693
4,802,952 2/1989 Kobori et al. ................ 257/417
4,907,065 3/1990 Sahakian ...................... 257/684
5,121,180 6/1992 Beringhause ................. 257/417

Primary Examiner—William Mintel
Assistant Examiner—Roy Potter
Attorney, Agent, or Firm—William E. Koch; Joe E. Barbee

[57] ABSTRACT

A semiconductor wafer level package used to encapsulate a device fabricated on a semiconductor substrate wafer before dicing of the wafer into individual chips. A cap wafer is bonded to the semiconductor substrate wafer using a pre-patterned frit glass as a bonding agent such that the device is hermetically sealed inside a cavity. A hole in the cap wafer allows electrical connections to be made to the device through electrodes which pass through the frit glass seal.

9 Claims, 1 Drawing Sheet

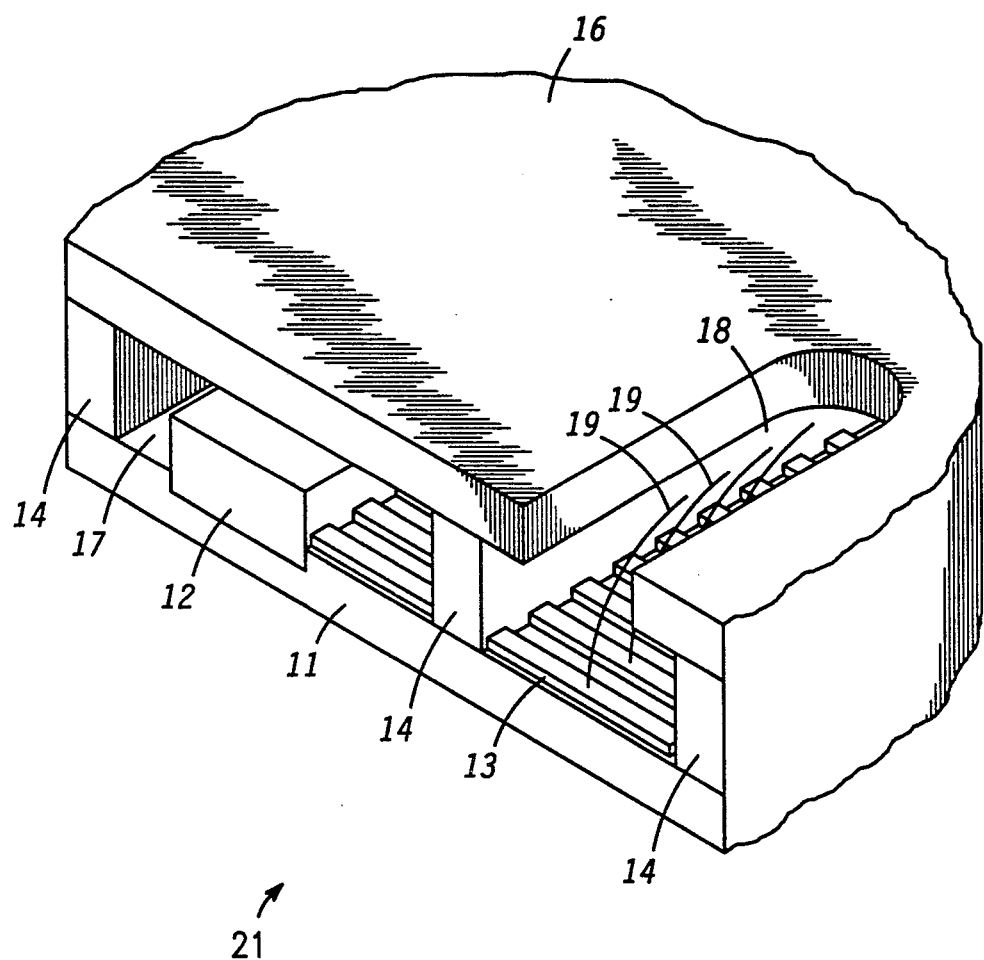

SEMICONDUCTOR WAFER LEVEL PACKAGE

BACKGROUND OF THE INVENTION

The present invention relates, in general, to semiconductor device packaging, and more particularly to packaging of semiconductor devices before wafer dicing.

Among the fundamental steps during fabrication of a semiconductor device is the dicing of the semiconductor wafer into individual chips which are then encapsulated in some form of package. Application of integrated circuit manufacturing methods to produce micromachined parts has resulted in devices comprising a wide range of microscopic mechanisms which are fabricated on the surface of a semiconductor wafer. Due to their size, these microscopic mechanisms are extremely vulnerable to damage from handling, small particles, moisture, and air flow. It is necessary to encapsulate these mechanisms in some form of hermetically sealed package so as to prevent such damage. It would be desirable to encapsulate the device at the wafer level, that is before separation into individual chips. This would avoid the damage to unprotected mechanisms which occurs during the separation and packaging process. The ideal encapsulation would provide sufficient protection to allow the use of simple, inexpensive separation and packaging methods such as wafer sawing and further mounting in a molded plastic package. Wafer level encapsulation would allow the devices to be thoroughly tested in the actual encapsulated working environment of the device. This early and thorough testing and the subsequent scrapping of bad devices minimizes the further processing which would otherwise be wasted on these bad devices. When fabricating integrated circuits a form of wafer level encapsulation is provided by deposition of a relatively thick layer of silicon dioxide as a final wafer processing step. This method cannot be used with devices which have moving parts since there is no way to provide an accurately controlled cavity within the silicon dioxide so as to allow movement of the parts.

Such a package must also have thermal characteristics which are especially well matched to the device being encapsulated to minimize the thermal stresses on the device. Extreme stress caused by thermal mismatching will damage or destroy all types of devices, but even the much lower values of thermally induced stress which would be acceptable with other types of devices will degrade the accuracy of many sensors.

According to the prior art a partial solution to this problem is described in an article entitled "A Rugged, High-Performance Piezoresistive Accelerometer", by B. Link et al, Sensors, October 1991 pp 43-46, which is incorporated herein by reference. This article describes a package using three layers of silicon which comprise a base, an accelerometer with a surrounding wall, and a lid. The three layers are bonded together to provide some environmental protection, but this prior art method still is described as requiring further packaging. In addition access must be provided to allow electrical contact to be made with the accelerometer by shaping a slot in the lid. Alignment of the three layers with one another requires access to the edges of the individual devices. These considerations require that the accelerometer be assembled individually rather than as a plurality of accelerometers before wafer dicing.

There is a need for a method of packaging devices which are fabricated on a semiconductor wafer before that wafer is diced into individual chips. The method must provide a hermetic seal, a thermal characteristic which closely matches that of the device, and provide a well controlled cavity within which micromachined parts can move. The package must be extremely inexpensive to manufacture, yet provide for electrical connections to the device inside the cavity without compromising the other characteristics of the package or the encapsulated device.

SUMMARY OF THE INVENTION

Briefly stated, the present invention provides a semiconductor wafer level package which may be used to encapsulate a device fabricated on the surface of a semiconductor substrate wafer before dicing of the wafer into individual chips. A cap wafer is bonded to the semiconductor substrate wafer using a pattern of frit glass as a bonding agent such that the device is hermetically sealed inside a cavity formed by the frit glass, the substrate wafer and the cap wafer. A hole in the cap wafer allows electrical connections to be made to electrodes which pass through the frit glass seal to connect with the device.

BRIEF DESCRIPTION OF THE DRAWING

The single FIGURE shows a perspective cross sectional view of a device encapsulated within a semiconductor wafer level package in accordance with the present invention.

DETAILED DESCRIPTION OF THE DRAWING

The single figure shows a cross sectional view of a device 12 which is encapsulated within a semiconductor wafer level package 21 in accordance with the present invention. Typically a plurality of such devices together with external structures such as test devices and scribe channels will be fabricated as part of the total semiconductor wafer level package. For clarity, these well known external structures are omitted from the drawing and only the portion of the semiconductor wafer level package 21 which contains device 12 is shown. Device 12 is fabricated on a semiconductor substrate wafer 11 which comprises a wafer of semiconductor material before the wafer has been diced into a plurality of distinct chips. Device 12 may be any of the devices which are commonly fabricated using the semiconductor wafer. Typically such devices are integrated circuit structures, micromachined sensors such as accelerometers, and other micromachined structures.

A cap wafer 16 is prepared by providing a plurality of holes 18 which extend completely through cap wafer 16. In a preferred embodiment, holes 18 are provided by drilling or anisotropic etching; however any suitable technique could be used. A plurality of frit glass walls 14 comprising a predetermined pattern of frit glass having a predetermined height and thickness is then deposited on cap wafer 16. The predetermined pattern is such that device 12 will be completely surrounded by frit glass walls 14. Frit glass walls 14 are typically deposited by a silk screening method. This method uses a silk-screen which is patterned with the desired pattern for frit glass walls 14. A slurry comprising a mixture of organic binder and frit glass is deposited through the silk screen. The combination is fired by heating to a high enough temperature to burn out the organic binder. Selection and use of the binder as well as the subsequent firing comprise methods well known in the art of frit glass deposition. The frit glass itself is selected to allow bonding below the temperature at which aluminum forms an alloy with silicon, approximately 570 degrees Celsius. One suitable compound for the frit glass is CF-8 glass, identified as Nippon Electric Glass Co., Ltd. catalog number E002EGA4C8910, and sold in the United States by Nippon Electric Glass America, Inc., Des Plains, Iowa. For convenience one preferred embodiment of the invention uses a proprietary glass formulation designated as EG9251 and manufactured by Ferro Corporation.

Cap wafer 16 is bonded to semiconductor substrate wafer 11 using frit glass walls 14 as a bonding agent. This bonding comprises heating the cap wafer 16, frit glass walls 14, and semiconductor substrate wafer 11. In this way semiconductor wafer level package 21 is formed as part of a capped wafer structure with device 12 hermetically sealed in a cavity 17 of predetermined dimensions formed by a combination of semiconductor substrate wafer 11, cap wafer 16, and frit glass walls 14. Cap wafer 16 is formed from a material which will form a suitable seal with the frit glass. Typical such materials are silicon wafers, quartz plates, certain metals, or the like. The material which comprises cap wafer 16 may be selected to provide a desired thermal expansion characteristic. For example, a silicon wafer used for cap wafer 16 will inherently have virtually identical thermal properties with a similar silicon wafer which is used for semiconductor substrate wafer 11.

A plurality of metal traces 13 are fabricated on semiconductor substrate wafer 11, prior to formation of frit glass walls 14. Metal traces 13 form a seal with frit glass walls 14. Metal traces 13 form a plurality of electrodes on semiconductor substrate wafer 11 which provide electrical coupling to device 12. Prior to frit glass application holes 18 are etched in cap wafer 16 in locations which provide ready access to a portion of the electrodes formed by metal traces 13 which extend outside cavity 17. A plurality of wires 19 are bonded to a plurality of pads formed on exterior portions of metal traces 13. Wires 19 extend through hole 18 and are themselves coupled to external electrical devices (not shown). Wires 19, hole 18 and metal traces 13 provide a simple, inexpensive method to provide a plurality of desired electrical couplings to device 12 while allowing device 12 to remain hermetically sealed within cavity 17.

The two wafers are typically aligned by means of locating holes formed in each wafer into which an alignment pin is inserted during the bonding process. Cap wafer 16 and semiconductor substrate wafer 11 may be further aligned optically by means of hole 18 and an appropriate alignment target formed on semiconductor substrate wafer 11. Alternatively a plurality of bonding pads formed as part of metal traces 13 are used for visual alignment. The capped wafer structure is then introduced into a controlled environment which typically comprises an inert gas under pressure such as helium, argon or nitrogen. While in the inert gas, cap wafer 16 and semiconductor substrate wafer 11 are heated to bond them together to form semiconductor wafer level package 21. The bonding hermetically seals the capped wafer structure capturing the inert gas within cavity 17. The controlled environment provides a predetermined damping action for mechanical motion of device 12. The predetermined damping action is readily controlled by altering the composition and pressure of the inert gas. The capped wafer structure is then diced into a plurality of composite chips by sawing, a method well known in the semiconductor art. The composite chips are then typically further encapsulated within a plastic material.

Alternative embodiments of the present invention, include device 12 being a device which is fabricated separately from semiconductor substrate wafer 11 then mounted on semiconductor substrate wafer 11. Other embodiments include device 12 comprising any of the devices which are commonly fabricated using a semiconductor wafer. In these embodiments, device 12 may comprise integrated circuit structures, sensors such as accelerometers, and micromachined structures. Certain alternative embodiments deposit frit glass walls 14 on a surface of semiconductor substrate wafer 11. Many embodiments combine a plurality of device structures within cavity 17, for example an accelerometer with the associated control circuitry. Other alternative embodiments utilize alternative methods well known in the art to form frit glass walls 14. These methods include defining the pattern of frit glass walls 14 by photolithography. Still other methods for deposition of frit glass walls 14 include: a syringe or needle, electrophoretic deposition, or use of a centrifuge.

By now it should be clear that the present invention provides a method for packaging devices which are fabricated on a semiconductor wafer before that wafer is diced into individual chips. The method provides a hermetic seal, a thermal characteristic which closely matches those of the device, and a well controlled cavity size within which micromachined parts can move. The package is inexpensive to manufacture and provides for electrical connections to the device inside the cavity without compromising the other characteristics of the package.

We claim:

1. A semiconductor wafer level package, comprising:
   at least one device fabricated on a semiconductor substrate wafer and wherein the semiconductor substrate wafer has not been diced into a plurality of distinct chips;
   a cap wafer having a predetermined height and thickness with a predetermined pattern of frit glass walls deposited on a surface, the predetermined pattern being such that at least the device is completely surrounded by the frit glass walls;
   a hermetic seal produced by bonding the cap wafer to the semiconductor substrate wafer using the frit glass walls as a bonding agent such that the device is hermetically sealed in a cavity of predetermined dimensions formed by a combination of the semiconductor substrate wafer, the cap wafer, and the frit glass walls; and
   at least one electrode formed on the surface of the semiconductor substrate wafer which provides electrical coupling to the device fabricated on the semiconductor substrate wafer; and
   a hole fabricated in the cap wafer which provides access to a portion of the electrode from outside the cavity.

2. The semiconductor wafer level package of claim 1 wherein the hole fabricated in the cap wafer is etched through the cap wafer before deposition of the frit glass.

3. The semiconductor wafer level package of claim 1 wherein the hole fabricated in the cap wafer is drilled through the cap wafer before deposition of the frit glass.

4. The semiconductor wafer level package of claim 1 wherein the predetermined pattern of frit glass walls is deposited by a silk screening process.

5. The semiconductor wafer level package of claim 1 wherein the predetermined pattern of frit glass walls is formed by photolithography.

6. The semiconductor wafer level package of claim 1 wherein the device comprises a micromachined sensor.

7. The semiconductor wafer level package of claim 6 wherein the micromachined sensor comprises an accelerometer.

8. The semiconductor wafer level package of claim 1 further comprising:
   a controlled environment sealed within the cavity of predetermined dimensions.

9. A semiconductor wafer level package, comprising:
   at least one device fabricated on a semiconductor substrate wafer and wherein the semiconductor substrate wafer has not been diced into a plurality of distinct chips;
   a cap wafer having a predetermined height and thickness with a predetermined pattern of frit glass walls deposited on a surface, the predetermined pattern being such that at least the device is completely surrounded by the frit glass walls;
   a hermetic seal produced by bonding the cap wafer to the semiconductor substrate wafer using the frit glass walls as a bonding agent such that the device is hermetically sealed in a cavity of predetermined dimensions formed by a combination of the semiconductor substrate wafer, the cap wafer, and the frit glass walls; and
   a controlled environment sealed within the cavity of predetermined dimensions which comprises an inert gas having a predetermined pressure which provides a predetermined mechanical damping of the device.

* * * * *